US008616728B2

(12) United States Patent
Odnoblyudov

(10) Patent No.: US 8,616,728 B2
(45) Date of Patent: Dec. 31, 2013

(54) ARRAY SOLID STATE LIGHTING DEVICE PACKAGE

(75) Inventor: Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 377 days.

(21) Appl. No.: 12/859,716

(22) Filed: Aug. 19, 2010

(65) Prior Publication Data

US 2012/0044688 A1    Feb. 23, 2012

(51) Int. Cl.
  *F21S 4/00*    (2006.01)
  *F21V 9/08*    (2006.01)
  *F21V 21/00*   (2006.01)

(52) U.S. Cl.
  USPC .................. 362/249.06; 362/249.02; 362/231

(58) Field of Classification Search
  USPC ......... 362/800, 249.02, 231, 249.06; 313/500
  See application file for complete search history.

(56) References Cited

U.S. PATENT DOCUMENTS

| | | | |
|---|---|---|---|
| 6,773,139 B2 * | 8/2004 | Sommers | 362/237 |
| 7,461,948 B2 | 12/2008 | van Voorst Vader et al. | |
| 7,857,472 B2 * | 12/2010 | Ko et al. | 362/84 |
| 2009/0103328 A1 | 4/2009 | Iwasaki | |
| 2009/0196069 A1 | 8/2009 | Iwasaki | |
| 2010/0053496 A1 * | 3/2010 | Park et al. | 349/61 |
| 2010/0079990 A1 | 4/2010 | Helbing | |
| 2010/0309441 A1 * | 12/2010 | Wang et al. | 353/61 |
| 2011/0305021 A1 * | 12/2011 | Xin | 362/249.02 |
| 2012/0098443 A1 * | 4/2012 | Lenk | 315/192 |

* cited by examiner

*Primary Examiner* — Karabi Guharay
(74) *Attorney, Agent, or Firm* — Perkins Coie LLP

(57) ABSTRACT

A solid state light (SSL) including solid state emitters (SSEs), and methods of manufacturing SSLs are disclosed herein. In one embodiment, an SSL comprises a support having a first portion and a second portion inward of the second portion. A first set of first SSEs having a first performance specification rating can be located at the first portion, and a second set of second SSEs having a second performance specification rating different than the first performance specification rating can be located at the second portion. The first and second sets of SSEs can emit a desired output across the SSL.

27 Claims, 6 Drawing Sheets

ARRAY SOLID STATE LIGHTING DEVICE PACKAGE

TECHNICAL FIELD

The present technology is related to solid state lights ("SSLs") and associated methods of operation and manufacture. In particular, the present disclosure is related to SSLs including an array of solid state emitters (SSEs) and associated methods of packaging.

BACKGROUND

Solid state lights ("SSLs") use solid state emitters ("SSEs") as sources of illumination. Generally, SSLs are more energy efficient, generate less heat, provide greater resistance to shock and vibration, and have longer life spans than conventional lighting devices that use filaments, plasma, or gas as sources of illumination (e.g., florescent or incandescent lights).

A conventional type of SSL is a "white light" SSE. White light requires a mixture of wavelengths to be perceived by human eyes. However, SSEs typically only emit light at one particular wavelength (e.g., blue light), so SSEs must be modified to emulate white light. One conventional technique for modulating the light from SSEs includes depositing a converter material (e.g., phosphor) on the SSE. For example, FIG. 1A shows a conventional SSL 10 that includes a support 2, an SSE 4 attached to the support 2, and a converter material 6 on the SSE 4. As shown in FIG. 1B, the SSE 4 can include one or more layers of semiconductor material such as an N-type gallium nitride ("GaN") material 14, a light-emitting indium gallium nitride ("InGaN") material 16 and/or InGaN/GaN multiple quantum wells, and a P-type GaN material 18 on one another in series supported by a substrate 12. The SSE 4 can be a lateral-type device that includes a first contact 20 on the P-type GaN material 18 and a second contact 22 on the N-type GaN material 14 spaced laterally apart from the first contact 20. Referring to both FIGS. 1A and 1B, the SSE 4 emits blue light that stimulates the converter material 6 to emit light at a desired frequency (e.g., yellow light). The combination of the emissions from the SSE 4 and the converter material 6 appears white to human eyes if the wavelengths of the emissions are matched appropriately.

SSLs including multiple SSEs arranged in an array are becoming popular because they produce a greater luminous flux output with a smaller footprint, and also reduce the cost of packaging. FIG. 2A is a schematic cross-sectional view of a conventional multi-SSE device 50 having a support 52, a plurality of SSEs 4 attached to the support 52, and a converter material 56 over the support 52 and the SSEs 4. The multi-SSE device 50 also has a single lens 58 over the SSEs 4. The SSEs 4 are connected to a common anode and cathode such that all of the SSEs 4 operate together. FIG. 2B is a schematic top plan view of a common pattern for the SSEs 4 in conventional multi-SSE devices. Conventional multi-SSE devices typically have a two-dimensional grid of identical SSEs in which adjacent SSEs are spaced apart from each other by a constant distance throughout the entire array. In other conventional multi-SSE devices, arrays include assorted SSEs randomly arranged and spaced apart from each other throughout the array.

To select SSEs for a particular array, SSEs can be categorized by performance specifications (e.g., luminous flux, peak emission wavelength, forward voltage, and/or other performance criteria) in a process known to those skilled in the art as "binning." During the binning process, individual SSEs are given a performance specification rating for a desired property at a set temperature, and placed in a category with SSEs having the same performance specification rating. For example, SSEs can be rated based on their luminous flux at room temperature, 25° C., and SSEs having a luminous flux rating in a given range can be placed in the same category (e.g., Bin 1). The SSEs in conventional arrays are generally selected from a single bin, such that all of the SSEs in an array have the same performance specification rating.

One drawback of such conventional multi-SSE devices is that the temperature across the device can vary (e.g., 10° C. variance) and cause undesirable outputs. Lines 2X and 2Y in FIG. 2B illustrate a temperature gradient across the conventional multi-SSE device 50 in which the temperatures are higher toward the center of the device 50 than the periphery. The temperature affects the output and other performance criteria of SSEs (e.g., thermal derating). For example, SSEs having the same performance specification rating at 25° C. may decrease luminous flux output by 15% at 85° C. and 20% at 125° C. The SSEs toward the center of the device accordingly have a lower output or otherwise perform differently than the SSEs around the periphery. Additionally, heat causes some components of SSLs to deteriorate and fail over time. For example, phosphor coating deteriorates faster at higher temperatures, thus changing the color of the light emitted by the SSL, and the junctions in the light producing materials deteriorate from exposure to heat, thereby reducing the light output at a given current (i.e., reduces the efficiency). Therefore, the SSEs at the center of a multi-SSE device operate differently and have shorter life spans than the SSEs around the periphery of the device. Disadvantageously, this creates a non-uniform output across the multi-SSE device.

DETAILED DESCRIPTION

Specific details of several embodiments of solid state lights ("SSLs") and associated methods of manufacturing SSLs are described below. The term "SSL" generally refers to "solid state light" and/or "solid state lighting device" according to the context in which it is used. The term "SSE" generally refers to solid state components that convert electrical energy into electromagnetic radiation in the visible, ultraviolet, infrared and/or other spectra. SSEs include semiconductor light-emitting diodes ("LEDs"), polymer light-emitting diodes ("PLEDs"), organic light-emitting diodes ("OLEDs"), or other types of solid state devices that convert electrical energy into electromagnetic radiation in a desired spectrum. The term "phosphor" generally refers to a material that can continue emitting light after exposure to energy (e.g., electrons and/or photons). Additionally, packaged SSLs and methods of manufacturing SSL assemblies are specifically described below to provide an enabling disclosure, but the package and methods can be applied to any SSL. A person skilled in the relevant art will understand that the new technology may have additional embodiments and that the new technology may be practiced without several of the details of the embodiments described below with reference to FIGS. 3A-4B.

Figure 1A:
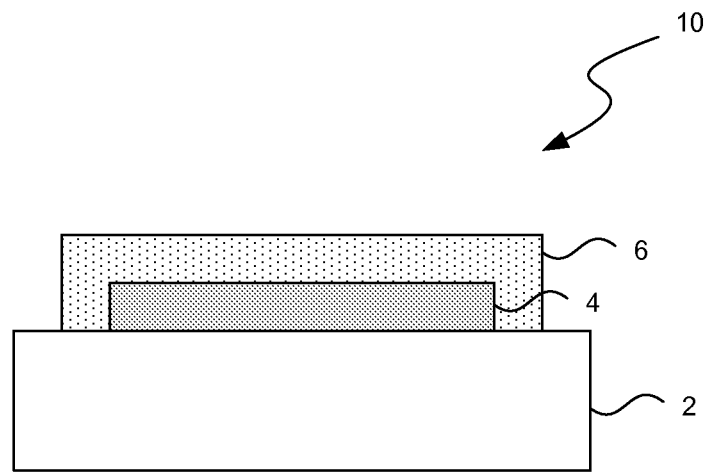
FIG. 1A is a cross-sectional view of a conventional SSL in accordance with the prior art.
Figure 1B:
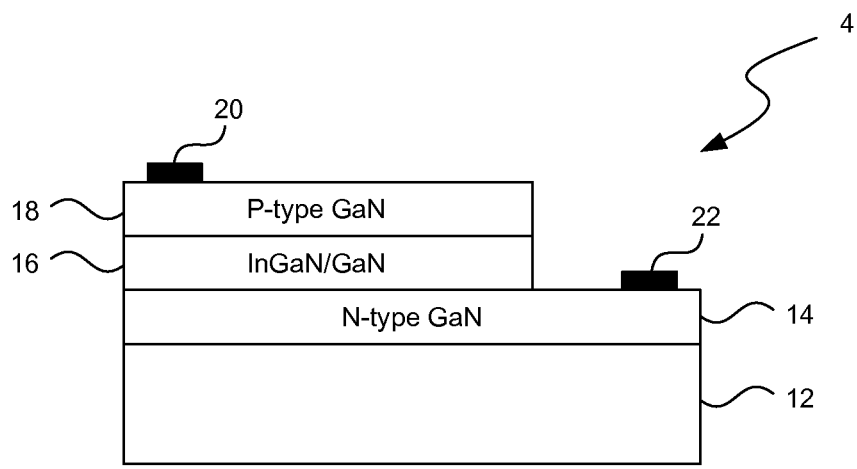
FIG. 1B is a cross-sectional view of an LED in accordance with the prior art.
Figure 3A:
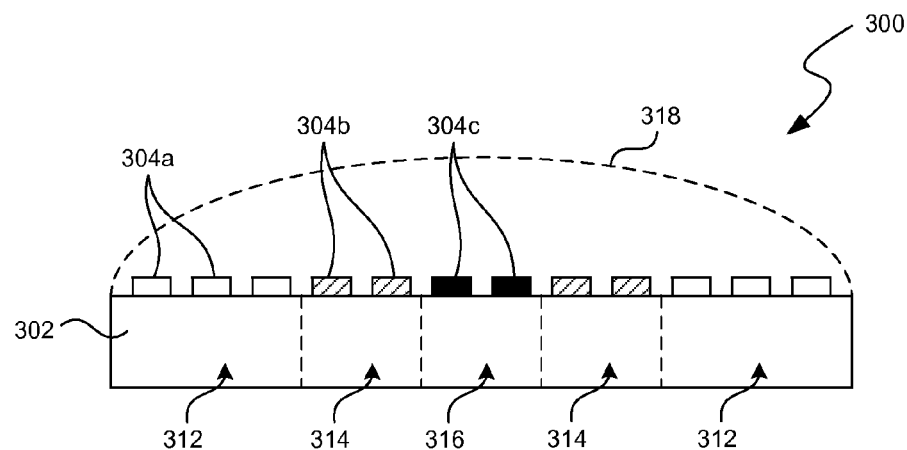
FIG. 3A is a schematic cross-sectional view and FIG. 3B is a schematic top plan view of a multi-SSE device in accordance with an embodiment of the new technology.
Figure 3B:
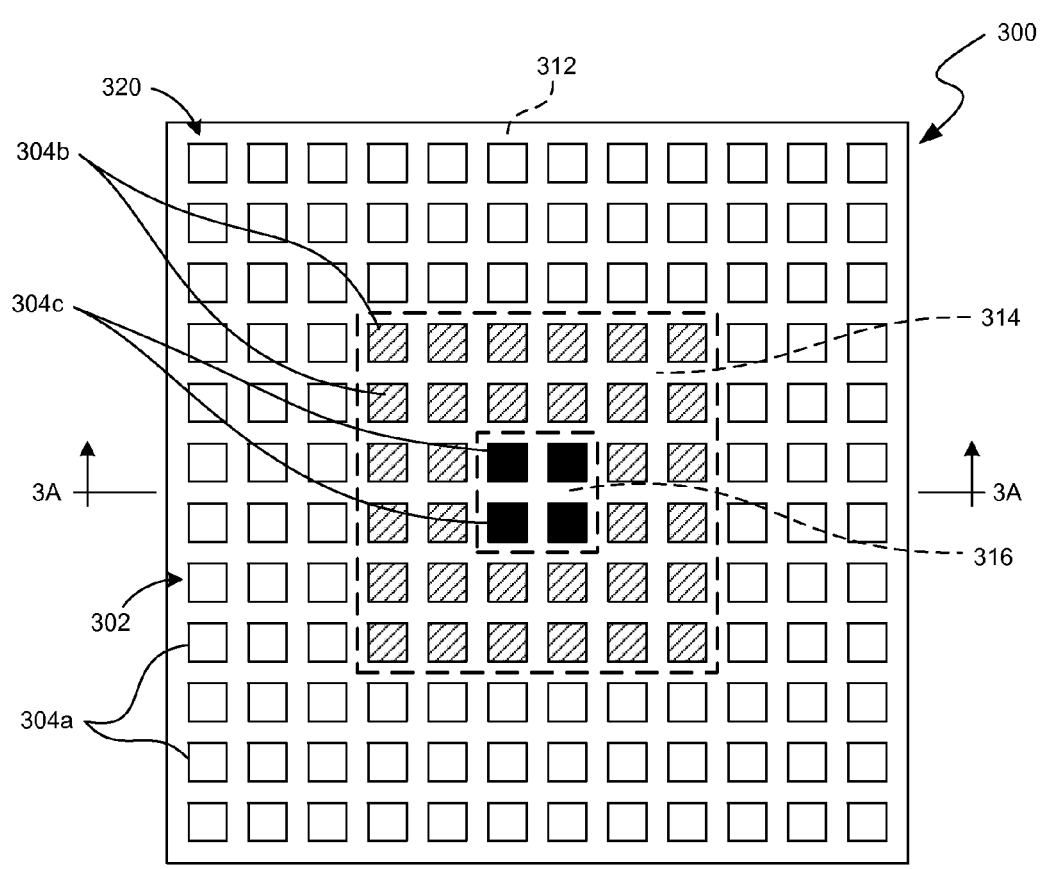
Figure 3C:
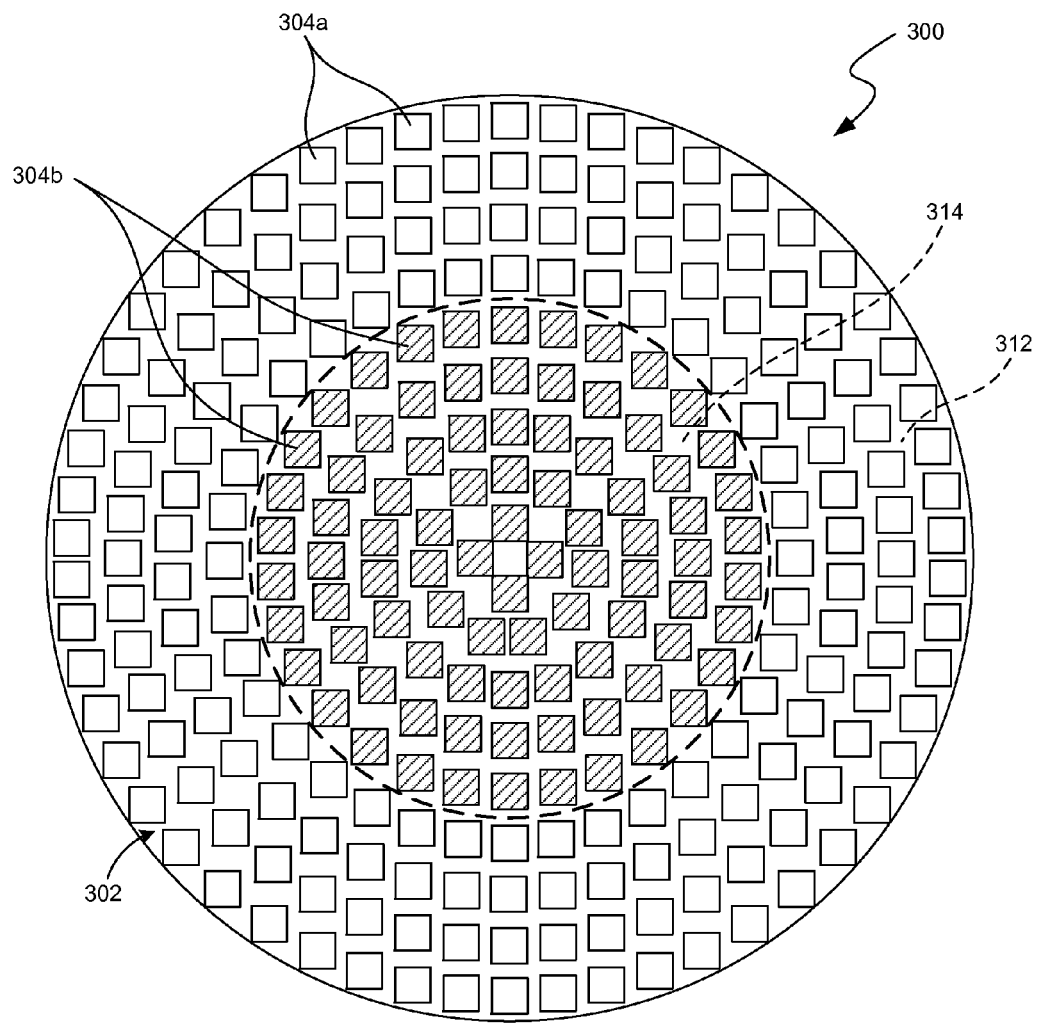
FIG. 3C is a schematic top plan view of a multi-SSE device in accordance with another embodiment of the new technology.

FIGS. 3A-3C illustrate multi-SSE devices 300 in accordance with several embodiments of the new technology. The multi-SSE devices 300 can include a support 302 and a plurality of SSEs 304 (identified individually by reference numbers 304a, 304b and 304c) configured in an array on and/or in the support 302. The SSEs 304 can be arranged in a grid array as shown in FIGS. 3A and 3B, or in a circular array as shown in FIG. 3C. In other embodiments the SSEs can be arranged in curved, radial or other types of arrays. Additionally, the multi-SSE devices 300 can optionally include a converter material 318 (e.g., the converter material 6 described with reference to FIG. 1A) at least covering the SSEs 304 and/or a conditioning element (e.g., a lens and/or diffuser; not shown).

The support 302 can include a plurality of portions or regions defined by the temperature profile across the face of the array. For example, the support 302 of the specific embodiment shown in FIGS. 3A and 3B has a first portion 312 corresponding to a first temperature range, a second portion 314 corresponding to a second temperature range, and a third portion 316 corresponding to a third temperature range. The first, second and third temperature ranges can be different from each other. During operation, the device 300 generally has a temperature gradient that increases toward the center of the support 302. Accordingly, the second temperature range can be higher than the first temperature range, and the third temperature range can be higher than the second temperature range. In other embodiments, the temperature gradient may differ and/or the substrate 302 can have only two portions as shown in FIG. 3C, or more than three portions (e.g., 4, 5, 6, etc.) Additionally, although the portions 312, 314, 316 in FIG. 3B are rectilinear, the portions of the substrate 302 can be circular as shown in FIG. 3C. In other embodiments, the portions of the substrate 302 can be oval, elliptical, or any other suitable shape that corresponds to the temperature profile or other parameter across the face of the substrate 302.

The SSEs 304 can have a plurality of sets of SSEs in which the SSEs of the different sets have different performance specification ratings. For example, in the specific embodiment shown in FIGS. 3A and 3B, the SSEs 304 can include a first set of first SSEs 304a, a second set of second SSEs 304b, and a third set of third SSEs 304c. The SSEs 304 can be arranged such that each set of SSEs is located in a corresponding, discrete portion of the support 302. In the embodiment shown in FIGS. 3A and 3B, for example, the first set of first SSEs 304a can be located in the first portion 312, the second set of second SSEs 304b can be located in the second portion 314, and the third set of third SSEs 304c can be located in the third portion 316. In the specific embodiment shown in FIG. 3C, the SSEs 304 can include only the first set of first SSEs 304a and the second set of second SSEs 304b. In other embodiments, the multi-SSE device 300 can include more or less sets of SSEs carried by the support 302 than those shown in FIGS. 3A-3C.

In the embodiment shown in FIGS. 3A and 3B, the sets of SSEs can be arranged on the corresponding portions of the support 302 such that the different performance specification ratings of the SSE sets produce a desired output profile across the device 300 (e.g., a uniform light intensity across the face of the substrate 302). For example, since the device 300 has a thermal gradient that causes different thermal deratings for SSEs 304 on different portions of the support 302, the performance specification rating of each SSE set can be selected to compensate for the different thermal derating effects across the surface of the substrate 302. The performance specification can be the luminous flux produced by the SSEs in the different SSE sets. In the specific embodiment shown in FIGS. 3A and 3B, the first SSEs 304a can have a first luminous flux rating at a given temperature, the second SSEs 304b can have a second luminous flux rating at the given temperature higher than the first luminous flux rating, and the SSEs 304c can have a third luminous flux rating at the given temperature higher than the second luminous flux rating. When the temperature increases toward the central-most portion of the multi-SSE device 300, the third SSEs 304c operate at the highest temperature and thereby experience the most thermal derating of the luminous flux output (e.g., a 25% decrease in output). The second SSEs 304b experience less thermal derating of luminous flux output (e.g., 15% output decrease) and the first SSEs 304a experience the least thermal derating (e.g., 10% output decrease). By locating the third SSEs 304c with the higher third luminous flux rating in the third portion 316 of the substrate 302 where the temperature is the highest, the greater derating of the third SSEs 304c caused by the higher temperatures in the third portion 316 is offset from the higher third luminous flux rating of the third SSEs 304c. Additionally, by locating the second SSEs 304b that have the lower second luminous flux rating in the second portion 314 of the substrate 302 where the temperature is lower, the lesser derating of the second SSEs 304b is offset from the lower second luminous flux rating of the second SSEs 304b. The first SSEs 304a have still a lower derating that is offset from the lower first luminous flux rating. As a result, despite the different operating temperatures, the net luminous flux outputs in the different portions 312, 314, 316 of the substrate 302 can be more uniform compared to conventional multi-SSE devices that have SSEs with the same luminous flux rating throughout the array. In other embodiments having a different temperature gradient, the sets of SSEs can be arranged so that those having higher luminous flux ratings are at portions of a support operating at higher temperatures.

In another embodiment, the performance specification can include peak emission wavelength and the sets of SSEs can be configured to produce a desired color or color profile across the device 300. Peak wavelength generally increases with increasing temperature. Accordingly, SSEs having a performance specification including a shorter peak emission wavelength can be arranged on portions of the support that operate at higher temperatures. For example, in the embodiment shown in FIGS. 3A and 3B, the first set of first SSEs 304a at the first portion 312 can have a first performance specification rating defined by a longer peak emission wavelength than the second and third sets of SSEs 304b-c. Since the first SSEs 304a operate at a lower temperature than the second and third SSEs 304b-c, the device 300 can be tailored to emit a desired color profile (e.g., a uniform color across the substrate 302). In other embodiments having a different temperature gradient, the sets of SSEs can be arranged so that those having lower peak emission wavelengths are on portions of a support operating at higher temperatures to create a wider mixture of colors across the array.

In further embodiments, the performance specification can include forward voltage, which generally decreases as temperature increases. Accordingly, SSEs having a performance specification including a higher forward voltage can be arranged on portions of the support that operate at higher temperatures (e.g., toward the center of the device 300). In yet further embodiments, the performance specification can include a different and/or plurality of properties associated with SSEs, and sets of SSEs can be configured to emit a desired output across the device 300. For example, the SSEs with different performance specification ratings can be distributed across the portions of the substrate 302 based on both luminous flux ratings and the peak emission wavelength ratings to control the intensity and color profiles. In still further embodiments, the sets of SSEs can include one SSE and the multi-SSE device 300 can include at least two SSEs having different performance specification ratings.

Referring to FIG. 3B, the plurality of SSEs 304 can be arranged in an array 320 having several different operating characteristics. For example, the first set of first SSEs 304a can define a peripheral region of the array 320, the second set of second SSEs 304b can define an intermediate region, and the third set of third SSEs 304c can define a central region. In the embodiment in FIG. 3B, individual SSEs 304 in the array 320 can be spaced apart from one another by a uniform distance. In an alternate embodiment, the individual first SSEs 304a can be spaced apart from one another by a first distance, the individual second SSEs 304b can be spaced apart from one another by a second distance, and the individual third SSEs 304c can be spaced apart from one another by a third distance. In further embodiments, the individual first through third SSEs 304a-c can be spaced apart by varying distances throughout the peripheral, intermediate, and central regions of the array 320, respectively.

Additionally, each set of SSEs can include a different number of individual SSEs. As shown in FIG. 3B, the first set first SSEs 304a at the first portion 312 of the support 302 can include the most SSEs, the second set of second SSEs 304b can include fewer SSEs, and the third set of third SSEs 304c can include the least number of SSEs. The third SSEs 304c at the third portion 316 of the support 302 can be most expensive to manufacture because the third SSEs 304c have a performance specification including a superior rating (e.g., luminous flux) to compensate for the most thermal derating. Advantageously, the embodiment shown in FIGS. 3A and 3B needs fewer third SSEs 304c since those SSEs need only be in the highest temperature portions of the device 300.

Figure 2A:
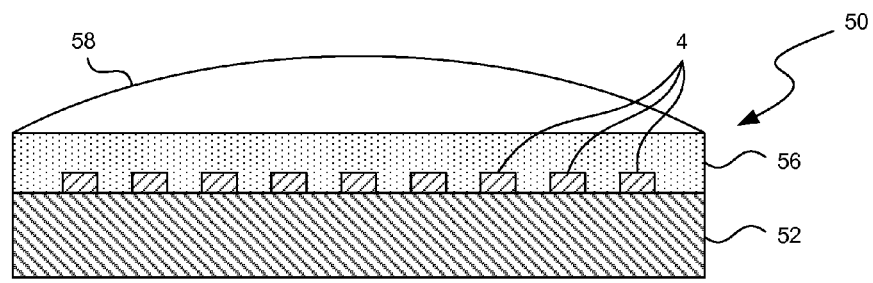
FIG. 2A is a partially schematic cross-sectional view and FIG. 2B is a schematic top plan view of a conventional multi-SSE device in accordance with the prior art.
Figure 2B:
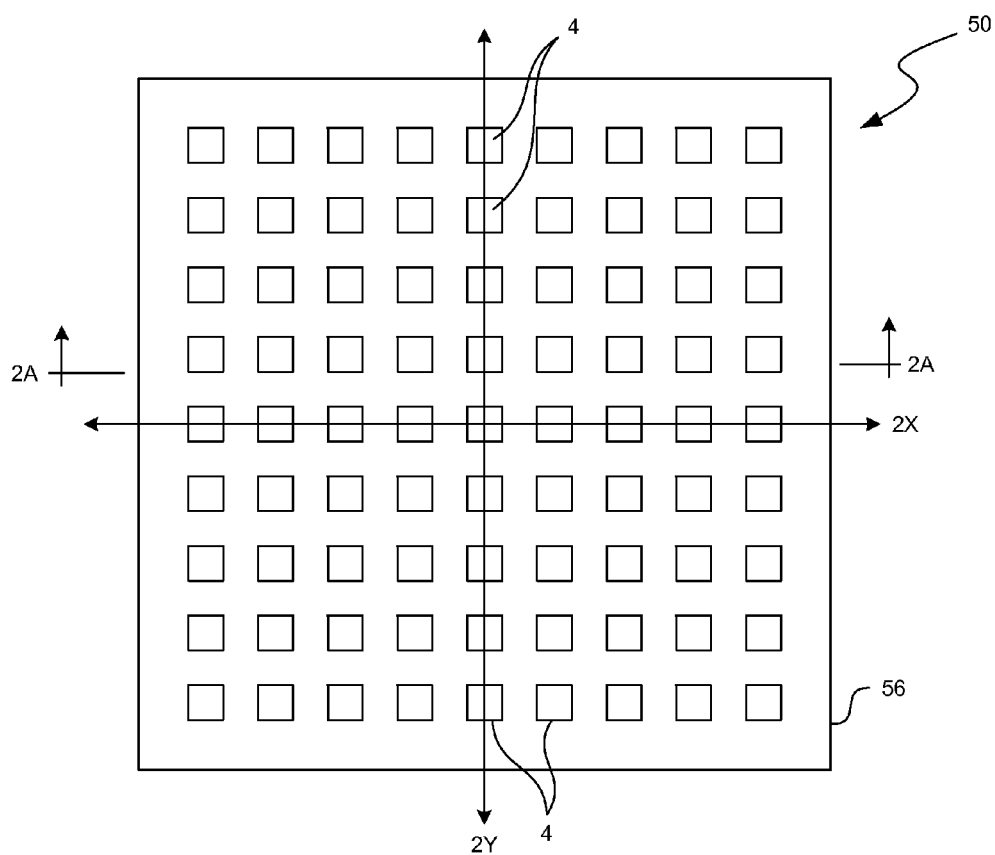
Figure 4A:
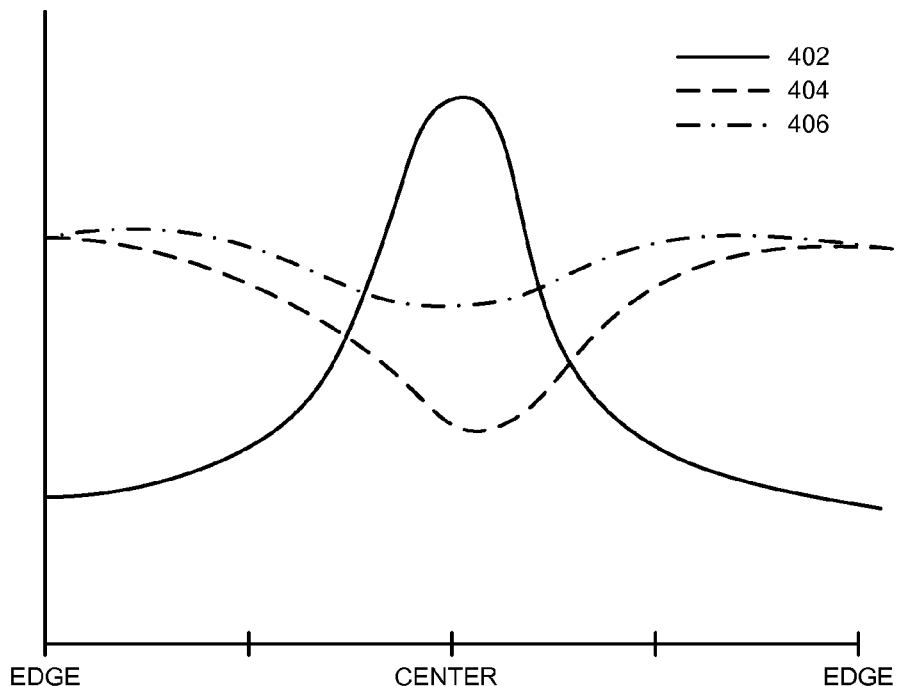
FIG. 4A is a graph showing the relationship between the luminous flux of a multi-SSE device and the temperature of the multi-SSE device in accordance with an embodiment of the new technology.

FIG. 4A is a graph showing the relationship between the luminous flux across a multi-SSE device and the temperature across the multi-SSE device in accordance with an embodiment of the new technology. The curve 402 shows a temperature gradient over a multi-SSE device and illustrates the temperature increase toward the center of the device. The curve 404 shows the luminous flux across a conventional multi-SSE device, such as the device 200 shown in FIG. 2B, and the curve 406 shows the luminous flux across a multi-SSE device in accordance with an embodiment of the new technology. As the temperature increases, the luminous flux of the conventional device decreases toward the center causing a non-uniform luminous flux across the device. However, the curve 406 shows that a device in accordance with the new technology can emit a generally more uniform luminous flux across the multi-SSE device than the conventional device. As described above with reference to FIGS. 3A and 3B, arranging sets of SSEs with a higher luminous flux rating at the higher temperature portions of the device (e.g., central portion) offsets the higher thermal derating in such portions to provide a desired output across the device.

The temperature curve 402 also shows that the portions of the multi-SSE subject to higher temperatures are smaller than the lower temperature portions (i.e., the temperature increases dramatically toward the center of the device). Therefore, multi-SSLE devices in accordance with the technology can include more SSEs having a performance specification including a low luminous flux rating than SSEs having a performance specification including a high luminous flux rating. This enables SSEs with different performance specification ratings to be used on the same device, which in turn allows more SSEs per wafer to be used in a single application.

Figure 4B:
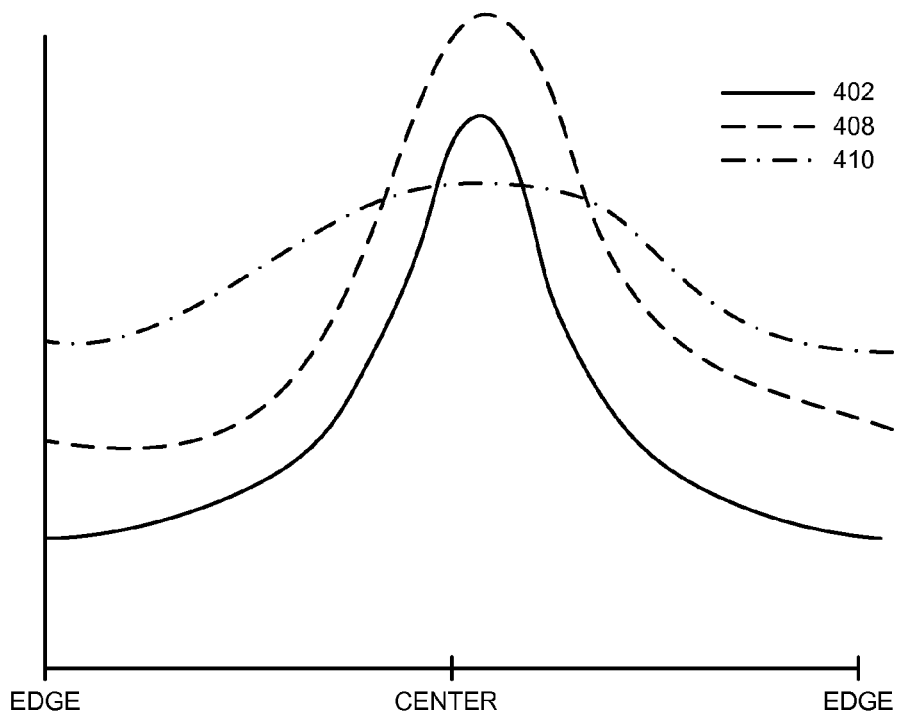
FIG. 4B is a graph showing the relationship between the peak emission wavelength of a multi-SSE device and the temperature of the multi-SSE device in accordance with an embodiment of the new technology.

FIG. 4B is a graph showing the relationship between the peak emission wavelength across a multi-SSE device and the temperature across the multi-SSE device in accordance with an embodiment of the new technology. Like FIG. 4A, the curve 402 shows a temperature gradient across a multi-SSE device, and illustrates the temperature increase toward the center of the device. The curve 408 shows the peak emission wavelength across a conventional multi-SSE device, such as the device shown in FIG. 2B, and the curve 410 shows the peak emission wavelength across a multi-SSE device in accordance with an embodiment of the new technology. As the temperature increases, the wavelength of the conventional device increases causing the device to emit a non-uniform color. However, the curve 410 shows that a device in accordance with the new technology can emit a generally more uniform peak wavelength across the multi-SSE device. As described above with reference to FIGS. 3A and 3B, arranging sets of SSEs with a performance specification including a lower peak emission wavelength toward the higher temperature portions of the device (e.g., central portion) prevents the thermal derating from affecting the uniformity of the color across the device to the same degree as devices with SSEs that have the same peak emission wavelength across the face of the device. Other embodiments in accordance with the new technology can include SSEs having a performance specification including both peak emission wavelength and luminous flux, creating a multi-SSE device emitting uniform color and intensity. Additionally, in other embodiments in accordance with the new technology, the performance specification can include different SSE properties (e.g., forward voltage).

Figure 5A:
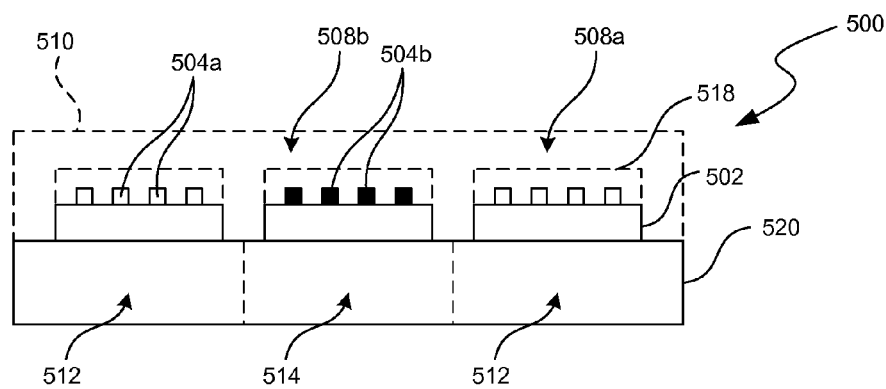
FIG. 5A is a schematic cross-sectional view and FIG. 5B is a schematic top plan view of a multi-SSL apparatus in accordance with an embodiment of the new technology.
Figure 5B:
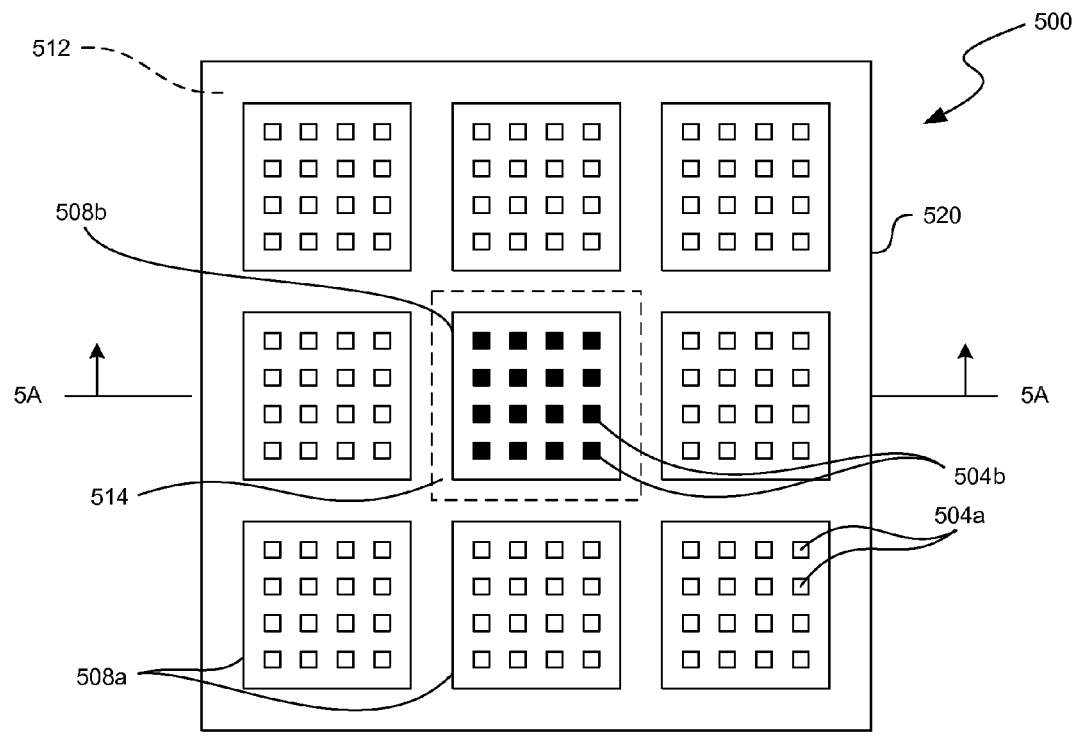

FIGS. 5A and 5B illustrate a multi-SSL apparatus 500 in accordance with several embodiments of the new technology. The multi-SSL apparatus 500 can include a base 520 and a plurality of SSLs 508 (identified individually as first SSLs 508a and a second SSL 508b) configured in an array on and/or in the base 520. The SSLs 508 can be arranged in a grid array as shown in FIGS. 5A and 5B. In further embodiments, the SSLs can be arranged in a circular, curved, radial, and/or other type of array. Each SSL 508 can include a support 502, one or more SSEs 504 (identified individually as first SSEs 504a and second SSEs 504b) arranged in an array on and/or in the support 502, and a converter material 518 covering the SSEs 504. Additionally, the multi-SSL apparatus 500 can optionally include a second converter material 510 (e.g., the converter material 6 described with reference to FIG. 1A) at least covering the SSLs 508.

Individual SSLs 508 can have a performance specification rating (e.g., luminous flux, peak emission wavelength, forward voltage, etc.) derived from the combination of performance specification ratings of the SSEs 504 on each SSL 508. For example, in FIGS. 5A and 5B, the first SSLs 508a can have a first performance specification rating that is a combination of the peak emission wavelengths of the first SSEs 504a, and the second SSL 508b can have a second performance specification rating different from the first performance specification rating that is a combination of the peak emission wavelengths of the second SSEs 504b. In further embodiments, the performance specification can include additional and/or other characteristics of the multi-SSL apparatus 500, such as luminous flux, forward voltage, etc. In some embodiments, the SSLs 508 can include SSEs 504 having the same performance specification rating (i.e., SSEs from the same bin). In other embodiments, the SSEs 508 can include SSEs 504 having different performance specification ratings (e.g. random SSEs, SSEs from more than 1 bin). In some other embodiments, similar to the SSEs 300 described in FIGS. 3A-C, each SSL 508 can include SSEs 504 arranged on the support 504 according to the performance specification rating of each SSE 504 and the temperature profile across the SSL 508 at its position on the base 520.

The SSLs 508 can be arranged on portions of the base 520 such that the different performance specification ratings of the SSLs 508 produce a desired output profile across the apparatus 500 (e.g., a uniform color across the face of the apparatus). Similar to the device 300 described above with reference to FIGS. 3A-C, the multi-SSL apparatus 500 can have a thermal gradient that causes different thermal deratings for SSLs 508 on different portions of the base 520. Accordingly, the base 520 can include a plurality of portions defined by the operating temperature across the base 520, and the SSLs 508 can be selected for each portion based on their performance specification ratings to compensate for the different thermal derating effects across the surface of the base 520. For example, the base 520 of the specific embodiment shown in FIGS. 5A and 5B has a first portion 512 corresponding to a first operating temperature range and a second portion 514 corresponding to a second operating temperature range higher than the first temperature range. The first SSLs 508a having the first performance specification rating (e.g., long peak emission wavelength) are arranged on the first portion 512 and the second SSL 508b having the second performance specification rating (e.g., shorter peak emission wavelength) is on the second portion 514 to produce a desired output (e.g., a uniform color). In further embodiments in accordance with the new technology, multi-SSL apparatus 500 can include more than two portions (e.g., 3, 4, 5, etc.), each portion including one or more SSL(s) 508 having a performance specification rating that compensates for the temperature change across the base 502.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A solid state light (SSL) device, comprising:
a support having a first portion and a second portion inward of the first portion, wherein the first portion is defined by a first operating temperature range and the second portion is defined by a second operating temperature range higher than the first operating temperature range;
a first set of first solid state emitters (SSEs) at the first portion, wherein individual first SSEs have a first luminous flux rating; and
a second set of second SSEs at the second portion, wherein individual second SSEs have a second luminous flux rating higher than the first luminous flux rating,
wherein the first and second SSEs are selected based on the first and second operating temperature ranges, respectively, such that the first and second SSEs compensate for changes in luminous flux caused by the different operating temperature ranges in the first and second portions of the support, and
wherein the individual first and second SSEs are configured to emit a substantially uniform luminous flux across the first and second portions of the support such that the luminous flux of the first SSEs at the first portion is at least substantially the same as the luminous flux of the second SSEs at the second portion.

2. The SSL of claim 1 wherein the first SSEs have a first peak emission wavelength at a given temperature and the second SSEs have a second peak emission wavelength shorter than the first peak emission wavelength at the given temperature such that the color of light emitted by the first SSEs at the first portion of the support is at least substantially the same as the color of light emitted by the second SSEs at the second portion of the support.

3. The SSL of claim 2 wherein the first and second sets of first and second SSEs are arranged in an array configured to emit a substantially uniform color across the array.

4. The SSL of claim 1 wherein the first SSEs have a first forward voltage rating and the second SSEs have a second forward voltage rating higher than the first forward voltage.

5. The SSL of claim 1 wherein the support further comprises a third portion inward of the second portion, and the SSL further comprises:
a third set of third SSEs at the third portion, wherein individual third SSEs have a third luminous flux rating higher than the first and second luminous flux ratings.

6. The SSL of claim 1 wherein the first set comprises a peripheral-most set including the first SSEs and the second set comprises an inward set including the second SSEs.

7. The SSL of claim 1 wherein the first portion is larger than the second portion and the first set of first SSEs comprises more SSEs than the second set of second SSEs.

8. The SSL of claim 1 wherein the individual first SSEs in the first set are spaced apart from one another by a first distance and the individual second SSEs in the second set are spaced apart from one another by a second distance different than the first distance.

9. The SSL of claim 1 wherein:
the support further comprises a third portion defining a central portion of the support;
the second portion defines an intermediate portion outward of the third portion;
the first portion defines a peripheral portion outward of the second portion; and
the SSL further comprises a third set of third SSEs having a third luminous flux rating and located at the third portion.

10. A solid state light (SSL), comprising:
a support having a first region and a second region, wherein the first region is defined by a first operating temperature range and the second region is defined by a second operating temperature range higher than the first operating temperature range;
first solid state emitters (SSEs) located at the first region and having a first performance specification rating, wherein the first performance specification rating comprises a first peak emission wavelength at a given temperature; and
second SSEs located at the second region and having a second performance specification rating different from the first performance specification rating, wherein the second performance specification rating comprises a second peak emission wavelength at the given temperature shorter than the first peak emission wavelength, wherein the first and second SSEs with the first and second peak emission wavelengths are selected based on the first and second operating temperature ranges, respectively, such that the first and second SSEs compensate for changes in wavelength caused by the different operating temperature ranges in the first and second regions of the support, and wherein the individual first and second SSEs are configured to emit a substantially uniform color of light across the first and second regions of the support such that the color of light in the first region is at least substantially the same as the color of light in the second region.

11. The SSL of claim 10 wherein the first performance specification rating comprises a first luminous flux rating and the second performance specification rating comprises a second luminous flux rating higher than the first luminous flux such that the luminous flux of the first SSEs at the first portion is at least substantially the same as the luminous flux of the second SSEs at the second portion.

12. The SSL of claim 10 wherein the first performance specification rating comprises a first forward voltage rating and the second performance specification rating comprises a second forward voltage rating higher than the first performance specification rating, and wherein the SSL emits a substantially uniform forward voltage.

13. The SSL of claim 10 wherein the first region is larger than the second region and the SSL comprises more first SSEs than second SSEs.

14. The SSL of claim 10 wherein individual first SSEs are spaced apart from one another by a first distance and individual second SSEs are spaced apart from one another by a second distance different than the first distance.

15. The SSL of claim 10, further comprising:
an array including the first SSEs and the second SSEs, and wherein the SSL is configured to emit a substantially uniform color, forward voltage, and luminous flux across the array.

16. The SSL of claim 10 wherein:
the support further comprises a third region defined by a third operating temperature range higher than the second operating temperature range; and
the SSL further comprises third SSEs located at the third region having a third performance specification rating, wherein the third performance specification rating comprises a third peak emission wavelength shorter than the first and second peak emission wavelengths.

17. The SSL of claim 10 wherein:
the support further comprises a third region defined by a third operating temperature range higher than the second operating temperature range, wherein the third region defines a central region of the support;
the second region defines an intermediate region outward of the third region;
the first region defines a peripheral region outward of the second region; and
the SSL further comprises third SSEs located at the third region and having a third performance specification rating, wherein the third performance specification rating comprises a third peak emission wavelength shorter than the first and second peak emission wavelengths.

18. A multi-solid state light (SSL) apparatus comprising:
a base having a first portion and a second portion, wherein the first portion is defined by a first operating temperature range and the second portion is defined by a second operating temperature range higher than the first operating temperature range;

first SSLs located at the first portion and having a first SSL performance specification rating, wherein the first SSL performance specification rating comprises a first luminous flux rating; and second SSLs located at the second portion and having a second SSL performance specification rating different from the first performance specification rating, wherein the second SSL performance specification rating comprises a second luminous flux rating, and wherein the second luminous flux rating is higher than the first luminous flux rating, and wherein the difference between the first and second luminous flux ratings is configured to compensate for the difference between the first and second operating temperature ranges such that the luminous flux emitted by the individual first SSLs at the first portion of the base is at least substantially the same as the luminous flux emitted by the second SSLs at the second portion of the base.

19. The apparatus of claim 18 wherein:
the first SSLs comprise a support and first solid state emitters (SSEs) at the support, wherein individual first SSEs have SSE performance specification ratings and the first SSL performance specification rating is a combination of the SSE performance specification ratings of the first SSEs; and
the second SSLs comprise a support and second SSEs at the support, wherein individual second SSEs have SSE performance specification ratings and the second SSL performance specification rating is a combination of the SSE performance specification ratings of the second SSEs.

20. A method of manufacturing a solid state light (SSL), comprising:
selecting a first set of first solid state emitters (SSEs) based on a first operating temperature range corresponding to a first portion of a support, wherein the first SSEs have a first performance specification rating, and wherein the first performance specification rating includes a first luminous flux rating;
selecting a second set of second SSEs based on a second operating temperature range corresponding to a second portion of the support and higher than the first operating temperature range, wherein the second SSEs have a second performance specification rating, and wherein the second performance specification rating includes a second luminous flux rating different from the first luminous flux rating;
arranging the first set of first SSEs at the first portion of the support; and
arranging the second set of second SSEs at the second portion of the support, wherein the difference between the first and second luminous flux ratings compensate for changes in luminous flux caused by the difference between the first and second operating temperature ranges such that the luminous flux of the individual first SSEs at the first portion is at least substantially the same as the luminous flux of the individual second SSEs at the second portion.

21. The SSL of claim 20 wherein:
the first performance specification rating comprises a first peak emission wavelength; and
the second performance specification rating comprises a second peak emission wavelength shorter than the first peak emission wavelength such that the color of light at the first portion is at least substantially the same as the color of light at the second portion.

22. The method of claim 20 wherein:
the first performance specification rating comprises a first forward voltage rating; and
the second performance specification rating comprises a second forward voltage rating higher than the first forward voltage rating.

23. The method of claim 20 wherein arranging further comprises:
spacing individual first SSEs in the first set a first distance apart from one another; and
spacing individual second SSEs in the second set a second distance apart from one another, the second distance being different than the first distance.

24. The method of claim 20, further comprising:
arranging a third set of third SSEs at a third portion of the support inward of the second portion, wherein individual third SSEs have a third performance specification rating different from the first and second performance specification ratings.

25. A method of manufacturing a solid state light (SSL), comprising:
selecting first solid state emitters (SSEs) having a first peak emission wavelength at a given temperature based on a first operating temperature range corresponding to a first portion of a support;
selecting second SSEs having a second peak emission wavelength at the given temperature based on a second operating temperature range corresponding to a second portion of the support, wherein the second operating temperature range is higher than the first operating temperature range, and wherein the and second peak emission wavelength is shorter than the first peak emission wavelength such that the first and second SSEs compensate for a change in wavelength caused by the higher second operating temperature range;
arranging the first SSEs at the first portion of the support; and
arranging the second SSEs at the second portion of the support, wherein the color of light emitted by the first SSEs at the first portion of the support is at least substantially the same a the color of light emitted by the second SSEs at the second portion of the support.

26. The method of claim 25 further comprising:
arranging the first and second SSEs in an array, wherein the array emits a substantially uniform luminous flux.

27. The method of claim 25, further comprising:
selecting third SSEs having a third peak emission wavelength different from the first and second peak emission wavelength to compensate for a change in wavelength caused by a third temperature operating range higher than the second operating temperature; and
arranging the third SSEs at a third portion of the support having the third operating temperature range, wherein the color of light emitted by the third SSEs at the third portion of the support is at least substantially the same as the color of light emitted by the first and second SSEs at the first and second portions of the support.

* * * * *

UNITED STATES PATENT AND TRADEMARK OFFICE
CERTIFICATE OF CORRECTION

PATENT NO. : 8,616,728 B2
APPLICATION NO. : 12/859716
DATED : December 31, 2013
INVENTOR(S) : Vladimir Odnoblyudov Page 1 of 1

It is certified that error appears in the above-identified patent and that said Letters Patent is hereby corrected as shown below:

In the Claims:

In column 9, line 21, in Claim 11, before "such that" insert -- rating, and wherein the SSL emits a substantially uniform luminous flux --.

In column 10, line 55, in Claim 20, delete "compensate" and insert -- compensates --, therefor.

In column 12, line 3, in Claim 25, after "wherein the" delete "and".

In column 12, line 13, in Claim 25, delete "a" and insert -- as --, therefor.

Signed and Sealed this
Fifteenth Day of April, 2014

Michelle K. Lee
*Deputy Director of the United States Patent and Trademark Office*